United States Patent [19]

Yagi et al.

[11] Patent Number: 4,834,794
[45] Date of Patent: May 30, 1989

[54] SOLDER COMPOSITION OF MIXED POWDERS

[75] Inventors: Hiroshi Yagi; Atsuzo Tamashima, both of Tokyo, Japan

[73] Assignee: TDK Corporation, Tokyo, Japan

[21] Appl. No.: 130,752

[22] Filed: Dec. 9, 1987

[30] Foreign Application Priority Data

Mar. 25, 1987 [JP] Japan ................................. 62-71232

[51] Int. Cl.$^4$ ............................................ B23K 35/26
[52] U.S. Cl. ................................. 75/255; 278/263.11
[58] Field of Search ................. 75/255; 420/558, 559, 420/570, 575, 565; 728/263.11

[56] References Cited

U.S. PATENT DOCUMENTS

| | | | |
|---|---|---|---|
| 2,725,287 | 11/1955 | Cronin | 75/255 |
| 3,155,491 | 11/1964 | Hoppin, III et al. | 75/255 |
| 3,617,396 | 11/1971 | Duff et al. | 75/255 |
| 4,381,944 | 5/1983 | Smith, Jr. et al. | 75/255 |
| 4,734,256 | 3/1988 | Liebermann et al. | 420/571 |

FOREIGN PATENT DOCUMENTS 36446 10/1971 Japan .................................. 420/558

OTHER PUBLICATIONS

Metals Handbook, vol. 6, Welding Brazing & Soldering, pp. 1069–1072.

*Primary Examiner*—Christopher W. Brody
*Attorney, Agent, or Firm*—Helfgott & Karas

[57] ABSTRACT

A solder composition having a low melting point and a high remelting point sufficient to permit electronic circuit elements to be fixed on a printed circuit board at a low soldering temperature to prevent thermal damage of the electronic circuit elements during the mounting and prevent the elements from dropping off from the board due to any heat applied thereto after soldering. The solder composition includes a low melting solder powder containing a metal additive for melting-point depression, and a reactive alloy powder. The low melting solder powder is melted to form a soldering layer which serves to mount electronic circuit elements on a printed circuit board at a relatively low soldering temperature. At the soldering temperature, the metal additive is reacted with the reactive alloy powder to cause the soldering layer to have a remelting temperature higher than a melting point of the solder composition or solder powder.

4 Claims, No Drawings

SOLDER COMPOSITION OF MIXED POWDERS

BACKGROUND OF THE INVENTION

1. Field of the Invention

This invention relates to a solder composition, and more particularly to a solder composition which is adapted to be conveniently used for mounting of electronic circuit elements on a printed circuit board.

2. Description of the Prior Art

In the art, there has been conventionally known a solder material which is capable of being melted at a relatively low temperature of about 130° C. or below. However, a remelting point of the conventional solder is as low as about 130° C. or below, so that it is substantially impossible to use the solder material for mounting of electronic circuit elements on a printed circuit board, because the circuit elements generally generate heat sufficient to cause the solder to be readily remelted during operation.

In view of the above, in practice, a solder material of a melting point between about 250° C. to 270° C. has been used for mounting of electronic circuit elements on a printed circuit board. More particularly, the mounting has been typically carried out in a manner to immerse a printed circuit board having electronic circuit elements temporarily placed thereon in a tank in which a melt of a solder material having a melting point between about 250° C. to 270° C. is spouted to flow, to thereby substantially mount the electronic circuit elements on the printed circuit board through the solder material. Also, a printed circuit board which has a cream-like solder previously applied thereto and has electronic circuit elements temporarily placed on the cream-like solder layer is prepared and then passed through an infrared irradiation oven at about 210° C. to 240° C. or a vapor atmosphere of an inert solvent of a high boiling temperature, thereby substantially mounting the electronic circuit elements on the printed circuit board through the solder layer.

However, the soldering methods as described above have no application to the mounting of electronic circuit elements inferior in thermal resistance on the printed circuit board. Accordingly, in the case where electronic circuit elements inferior in thermal resistance are to be mounted on a printed circuit board, it has been carried out to manually mount the electronic circuit elements on the printed circuit board after application of a solder material having a melting point of a relatively low temperature to the printed circuit board. Also, in the case where it is necessary to firstly mount electronic circuit elements on one surface of a printed circuit board via a solder material and secondly mount electronic circuit elements on the other surface of the printed circuit board via a solder material, in the first and second steps it is required to use a solder material different in a remelting point, namely, it is necessary that the solder material which is applied in the first step is higher in a remelting point than that which is applied in the second step. Otherwise, when the second step is carried out, the solder material having soldered the electronic circuit elements onto the one surface of the printed circuit board is remelted. The varying of a solder material, every time the second step is carried out, causes the mounting operation to be highly complicated.

SUMMARY OF THE INVENTION

The present invention has been made in view of the foregoing disadvantages of the prior art.

Accordingly, it is an object of the present invention to provide a solder composition which has a low melting point and a high remelting point.

It is another object of the present invention to provide a solder composition which is capable of mounting electronic circuit elements on a printed circuit board at a low soldering temperature to prevent thermal damage of electronic circuit elements during mounting operation.

It is a further object of the present invention to provide a solder composition which is prevented from being remelted due to heat generated by electronic circuit elements mounted on a printed circuit board during operation of the circuit elements, resulting in the circuit elements being prevented from dropping off from the printed circuit board.

In accordance with the present invention, a solder composition which is capable of accomplishing the above-noted objects is provided. The solder composition includes a low melting solder powder, the solder powder containing a metal additive for melting-point depression; and a reactive alloy powder. The metal additive is reacted with the alloy powder at a soldering temperature.

The low melting solder powder, when it is heated, is melted to form a soldering layer which serves to mount electronic circuit elements on a printed circuit board at a relatively low soldering temperature. At the soldering temperature, the metal additive is reacted with the alloy powder to cause the soldering layer to have a remelting point higher than a melting point of the solder composition or solder powder.

DETAILED DESCRIPTION OF THE INVENTION

Now, the present invention will be exemplified with reference to mounting of electronic circuit elements on a printed circuit board by soldering.

A solder composition of the present invention may be extensively used for various kinds of applications such as mounting of lead-less electronic circuit elements such as chip-type capacitors and the like on conductive patterns formed on a printed circuit board by soldering, mounting of surface-mounting-type electronic circuit elements having leads like crab legs on a printed circuit board by soldering, and the like.

The solder composition comprises a mixture of a low melting solder powder containing a metal additive for melting-point depression, and an alloy powder reacted with the metal additive at a soldering temperature which are mixed at a solid state. The solder composition is formulated to exhibit, at a soldering temperature, a liquid phase state or a substantially liquid phase state containing a solid phase in a small amount.

The low melting solder alloy may include those widely known in the art.

The metal additive contained in the low melting solder powder which has a relatively low melting point of about 130° C. or less may include Bi, In, Cd and the like.

The reactive alloy powder used may include an alloy powder formed between Se, Te and Tl, and Sn and/or Pb, and the like.

The low melting solder powder and reactive alloy powder may be mixed at a ratio of 40 to 90 : 60 to 10 by weight percent.

The so-formulalted solder composition may be formed in a solid state and applied, by means of a flux having stickness or the like, to external terminals of electronic circuit elements or onto a printed circuit board on which electronic circuit elements are to be mounted. The solder composition may be formed in a liquid state, which may be applied, by printing, to a conductive pattern formed on a printed circuit board. Then, a surface of an electronic circuit element which is to be mounted on the printed circuit board is contacted with the solder composition applied onto the printed circuit board or external terminals of an electronic circuit element are contacted with a surface of the printed circuit board to which the solder composition has been applied, so that the element may be positioned on the board. Subsequently, the printed circuit board having the electronic circuit element positioned thereon is passed through a drying oven at a relatively low temperature to fix the electronic circuit element on the printed circuit board by soldering.

At an initial stage of the soldering operation, the low melting solder powder is liquefied and diffused between the conductive pattern on the printed circuit board and the terminals of the electronic circuit element to form a soldering layer. When the diffused solder is then heated to a soldering temperature, the meltal additive for melting-point depression such as Bi, In, Cd or the like contained in the low melting solder powder is reacted with Se, Te and Tl contained in the reactive alloy powder to form a reaction product having a high remelting point. At this time, the metal additive reacted with Se, Te and Tl does not become inexistent in the reaction product, so that a remelting point of the soldering layer is determined depending on a remelting point of the remaining components. This results in a remelting point of the soldering layer being set at a level of about 150° C. or more higher than a melting point of the solder composition.

Thus, the solder composition of the present invention permits an electronic circuit element to be fixed on a printed circuit board at a low soldering temperature, so that a variety of electronic circuit elements including those inferior in thermal resistance may be effectively and positively mounted on a printed circuit board without any thermal damage although they are passed through a drying oven while being carried on the printed circuit board. Also, the solder composition of the present invention may be used for mounting electronic circuit elements on both surfaces of a printed circuit board. Further, even when the soldering layer formed by the present invention is exposed to a high temperature after fixing of an electronic circuit element on a printed circuit board by soldering, the metal additive for melting-point depression has been reacted with Se, Te and Tl contained in the reactive alloy powder to form an intermetallic compound having a higher remelting point, resulting in the electronic circuit element being kept firmly fixed on the printed circuit board.

As can be seen from the foregoing, the solder composition of the present invention is capable of permitting various kinds of electronic circuit elements inclusive of that lacking thermal resistance as well as that superior in heat resistance to be fixed on a printed circuit board by soldering according to the same procedure. Also, the present invention effectively prevents electronic circuit elements from dropping off from a printed circuit board even when they are exposed to high temperature after soldering.

While the invention has been described with a certain degree of particularity, obvious modifications and variations are possible in the light of the above teachings. It is therefore to be understood that within the scope of the appended claims, the invention may be practiced otherwise than as specifically described.

What is claimed is:

1. A solder composition adapted for soldering an electronic component onto a printed circuit board, comprising:
   a solder powder selected from the group consisting of Sn and Pb;
   a metal additive added in said solder powder as a part thereof and including at least one of elements selected from the group consisting of Bi, In and Cd for depressing a melting point of said solder powder; and
   an allow powder formed of elements selected from the group consisting of Se, Te and Tl, and elements selected from the group consisting of Sn and Pb,
   said alloy powder being admixed with said solder powder containing said metal additive,
   wherein when a mixture of said solder powder containing said metal additive added therein with said alloy powder is heated to a soldering temperature of at most 130° C., said metal additive is reacted with said alloy powder at said soldering temperature of at most 130° C., and such reaction between said metal additive and alloy powder results in a formation of an intermetallic compound which has a remelting point of at least 150° C.

2. A solder composition as defined in claim 1, wherein said metal additive is a mixture of Bi, In and Cd.

3. A solder composition as defined in claim 1, wherein said solder powder containing said metal additive added therein and said alloy powder are mixed at a ratio of 40 to 90:60 to 10 by weight percent.

4. A solder composition as defined in claim 9, wherein said metal additive is a mixture of Bi, In and Cd, and said solder powder containing said metal additive added therein and said alloy powder are mixed at a ratio of 40 to 90:60 to 10 by weight percent.

* * * * *